(12) United States Patent
Zeng

(10) Patent No.: US 11,990,523 B2
(45) Date of Patent: May 21, 2024

(54) SHIELD GATE TRENCH MOSFET DEVICE AND METHOD FOR MAKING THE SAME

(71) Applicant: Nantong Sanrise Integrated Circuit Co., LTD, Jiangsu (CN)

(72) Inventor: Dajie Zeng, Jiangsu (CN)

(73) Assignee: Nantong Sanrise Integrated Circuit Co., LTD, Jiangsu (CN)

( * ) Notice: Subject to any disclaimer, the term of this patent is extended or adjusted under 35 U.S.C. 154(b) by 87 days.

(21) Appl. No.: 17/499,967

(22) Filed: Oct. 13, 2021

(65) Prior Publication Data

US 2022/0173215 A1    Jun. 2, 2022

(30) Foreign Application Priority Data

Nov. 30, 2020 (CN) .......................... 202011369370.4

(51) Int. Cl.
*H01L 29/40* (2006.01)
*H01L 21/765* (2006.01)
*H01L 29/66* (2006.01)
*H01L 29/78* (2006.01)

(52) U.S. Cl.
CPC .......... *H01L 29/404* (2013.01); *H01L 21/765* (2013.01); *H01L 29/407* (2013.01); *H01L 29/66734* (2013.01); *H01L 29/7813* (2013.01)

(58) Field of Classification Search
CPC ... H01L 29/404; H01L 21/765; H01L 29/407; H01L 29/66734; H01L 29/7813; H01L 29/41766; H01L 29/66727; H01L 29/78642; H01L 29/41741; H01L 29/41775; H01L 29/4236; H01L 29/66484; H01L 29/66742; H01L 29/78618; H01L 29/78645
USPC ......................................................... 257/330
See application file for complete search history.

(56) References Cited

U.S. PATENT DOCUMENTS

| | | | | |
|---|---|---|---|---|
| 2014/0077278 | A1* | 3/2014 | Nozu | H01L 29/7813 257/773 |
| 2015/0137223 | A1* | 5/2015 | Siemieniec | H01L 29/7813 257/331 |
| 2017/0236934 | A1* | 8/2017 | Rankila | H01L 29/7813 438/468 |
| 2022/0149161 | A1* | 5/2022 | Hsieh | H01L 29/7813 |

\* cited by examiner

*Primary Examiner* — Mohammad M Hoque
(74) *Attorney, Agent, or Firm* — Banner & Witcoff, Ltd.

(57) ABSTRACT

The present application provides an SGT MOSFET device, a gate structure of which is a left-right structure, wherein a second field plate conductive material layer with a depth greater than that of a gate conductive material layer is formed between a source conductive material layer and the gate conductive material layer. When the device is reversely biased, depletion capability with respect to the drift region at a side close to a channel region is enhanced due to the feature that a spacing between the second field plate conductive material layer and the drift region is less than a spacing between the source conductive material layer and the drift region. The present application further provides a method for manufacturing an SGT MOSFET device.

9 Claims, 11 Drawing Sheets

SHIELD GATE TRENCH MOSFET DEVICE AND METHOD FOR MAKING THE SAME

CROSS-REFERENCES TO RELATED APPLICATIONS

This application claims the priority to Chinese patent application No. 202011369370.4, filed on Nov. 30, 2020, the disclosure of which is incorporated herein by reference in its entirety.

TECHNICAL FIELD

The present application relates to the field of semiconductor integrated circuit manufacturing, in particular to a shield gate trench (SGT) MOSFET device; the present application further relates to a method for manufacturing an SGT MOSFET device.

BACKGROUND

Compared with the conventional trench MOSFET, in an SGT MOSFET, a longitudinal source field plate, i.e., source polysilicon, is inserted into a drift region. The source field plate and the drift region are laterally depleted, so as to greatly increase the doping concentration of the drift region without reducing the breakdown voltage, thereby reducing the specific on-resistance and achieving better performance. There are two very common existing SGT MOSFET structures, which are separately introduced as follows:

Referring to FIG. 1, which is a schematic diagram of a structure of a first existing SGT MOSFET device, the first existing SGT MOSFET device is an SGT MOSFET with a top-bottom structure. Taking an N-type device as an example, the first existing SGT MOSFET device has a gate structure formed in a gate trench.

The gate trench is formed in an N-type first epitaxial layer 2. The first epitaxial layer 2 is formed on an N-type heavily doped semiconductor substrate 1. The semiconductor substrate 1 is usually a wafer structure.

Generally, the semiconductor substrate 1 is a heavily doped structure and serves as a drain region after backside thinning. In order to reduce reverse diffusion of the semiconductor substrate 1, the semiconductor substrate 1 is usually an arsenic-doped substrate. However, the lowest resistivity of a phosphorous-doped substrate available in the existing process is lower than that of the arsenic-doped substrate. Therefore, in a case of a relatively high substrate resistance proportion, for example, in a low voltage device below 40 V, the phosphorus-doped substrate is also commonly used. When the semiconductor substrate 1 becomes thinner, the heat dissipation of the device becomes better, and the substrate resistance can be reduced more significantly.

The gate structure shown in FIG. 1 is a top-bottom gate structure, in which source polysilicon 4 is formed at the bottom of the gate trench, and the source polysilicon 4 and the gate trench are isolated from each other by a shielding dielectric layer 3 provided therebetween. The shielding dielectric layer 3 needs to withstand the breakdown voltage of the device. Therefore, when the breakdown voltage required by the device becomes higher, the shielding dielectric layer 3 becomes thicker.

A polysilicon gate 6 is formed on the top of the gate trench, and the polysilicon gate 6 and the gate trench are isolated from each other by a gate dielectric layer provided therebetween, such as a gate oxide layer 5. The polysilicon gate 6 and the source polysilicon 4 are isolated from each other by an inter-polysilicon oxide layer provided therebetween.

A P-type doped channel region 7 is formed in a surface region of the first epitaxial layer 2, and the junction depth of the channel region 7 is less than or equal to the depth of a first side surface of the polysilicon gate 6. The surface of the channel region 7 covered by the first side surface of the polysilicon gate 6 is used to form a channel.

The first epitaxial layer 2 below the channel region 7 forms a drift region. The biggest difference between the SGT MOSFET and the conventional trench MOSFET is that the longitudinal source polysilicon 4 is laterally inserted into the drift region.

An N-type heavily doped source region 8 is formed on the surface of the channel region 7.

The N-type heavily doped drain region is formed by the thinned semiconductor substrate 1 or by stacking the thinned semiconductor substrate 1 and an N-type heavily doped backside ion implantation region.

The first existing SGT MOSFET device further includes an interlayer film 11 and a contact (CT) 9 penetrating through the interlayer film 11. The bottom of the contact 9 corresponding to the top of the source region 8 penetrates through the source region 8 to achieve contact with both the source region 8 and the channel region 7. The source and gate are formed by patterning a front side metal layer 10, and the source is connected to both the source region 8 and the channel region 7 by means of the corresponding contact 9 at the bottom. The source polysilicon 4 is also connected to the source by means of the corresponding contact 9 at the top. The gate is connected to the polysilicon gate 6 by means of the corresponding contact at the bottom.

Referring to FIG. 2, which is a schematic diagram of a design structure of a second existing SGT MOSFET device, the second existing SGT MOSFET device is an SGT MOSFET device with a left-right structure. Compared with the first existing SGT MOSFET device shown in FIG. 1, the second existing SGT MOSFET device has the following features:

A polysilicon gate 6a has a left-right structure. Such the polysilicon gate 6a having a left-right structure is formed by etching back the shielding dielectric layer 3 after the formation of the source polysilicon 4 and the shielding dielectric layer 3 and then filling a region where the shielding dielectric layer 3 is removed with a gate dielectric layer 5a and the polysilicon gate 6a.

It can be seen that the biggest difference between the first and second existing SGT MOSFET devices lies in:

the relative position of the polysilicon gate and source polysilicon, wherein the polysilicon gate 6 in FIG. 1 is located directly above the source polysilicon 4, thus forming a top-bottom structure; and polysilicon gate 6a in FIG. 2 is located at the left and right sides of the source polysilicon 4, thus forming a left-right structure.

The advantages and disadvantages of the two structures are as follows:

The process for achieving the top-bottom structure is more complicated for the following reason: the source polysilicon 4 is covered by the polysilicon gate 6 directly above it, so that the source polysilicon 4 cannot be directly connected to the contact, thus requiring additional lithography plate and process steps.

The process for achieving the left-right structure is simple and does not require particularly complicated process steps. In both structures, for example, the polysilicon gate 6a and the source polysilicon are both on the surface of the wafer, i.e., the surface of the first epitaxial layer 2, and thus can be directly and easily connected. However, compared with the top-bottom structure, the left-right structure has a larger contact area between the polysilicon gate and the source polysilicon, which results in a larger input capacitance.

For the left-right structure shown in FIG. 2, it is usually necessary to further improve the shielding dielectric layer 3, so that the thickness of the shielding dielectric layer 3 gradually varies. FIG. 3 is a schematic diagram of a design structure of a third existing SGT MOSFET device.

Compared with the second existing SGT MOSFET device shown in FIG. 2, the third existing SGT MOSFET device has the following features: the thickness of the shielding dielectric layer 3a gradually increases in the direction from the channel region 7 to the semiconductor substrate 1, thereby increasing the uniformity of the electric field intensity in the drift region 2. The specific reasons are as follows:

The voltage of the drift region 2 close to the channel region 7 is a voltage approximating the source voltage, i.e., 0 V, while in the body, the voltage gradually increases to the drain voltage. Since the voltage of the source polysilicon 4 is 0 V, a voltage difference between the source polysilicon 4 and the drift region 2 gradually increases in the direction from the channel region 7 to the semiconductor substrate 1. When the voltage difference between the source polysilicon 4 and the drift region 2 becomes smaller, the depletion capability of the source polysilicon 4 with respect to the drift region 2 becomes weaker; accordingly, the shielding dielectric layer 3a needs to be thinned to enhance the depletion capability with respect to the drift region 2. Therefore, in FIG. 3, the thickness of the shielding dielectric layer 3a gradually increases in the direction from the channel region 7 to the semiconductor substrate 1, so as to better deplete the drift region 2 and make the distribution of the electric field intensity in the body more uniform.

However, the structure of the shielding dielectric layer 3a with a gradually varying thickness as shown in FIG. 3 is very difficult to be achieved in actual processes.

BRIEF SUMMARY

The technical problem to be solved by the present application is to provide an SGT MOSFET device, which can adopt a left-right structure and can enhance depletion capability of a shielding structure with respect to a drift region close to a channel region when the device is reversely biased. To this end, the present application further provides a method for manufacturing an SGT MOSFET device.

In order to solve the above technical problem, a gate structure of the SGT MOSFET device provided by the present application comprises: a gate trench, a shielding dielectric layer, a source conductive material layer, a second field plate conductive material layer, and a gate conductive material layer.

The shielding dielectric layer is formed on an inner side surface of the gate trench, and the shielding dielectric layer encloses an intermediate trench in the gate trench; the source conductive material layer fills the intermediate trench.

The second field plate conductive material layer is formed in a first top sub-trench at both sides of the source conductive material layer, and the gate conductive material layer is formed in a second top sub-trench at both sides of the source conductive material layer.

The first top sub-trench and the second top sub-trench are both formed in the shielding dielectric layer.

The depth of the first top sub-trench is greater than the depth of the second top sub-trench, and the first top sub-trench is located between the source conductive material layer and the second top sub-trench in the lateral direction.

A first side surface of the second top sub-trench is on a corresponding side surface of the gate trench, and the gate conductive material layer and the first side surface of the second top sub-trench are spaced apart by a gate dielectric layer provided therebetween.

The second field plate conductive material layer fully fills the first top sub-trench.

The gate trench is formed in a first epitaxial layer of a first conductivity type, a doped channel region of a second conductivity type is formed in a surface region of the first epitaxial layer, and the second top trench penetrates through the channel region.

The first epitaxial layer at the bottom of the channel region forms a drift region, and a heavily doped source region of the first conductivity type is formed on the surface of the channel region; a heavily doped drain region of the first conductivity type is formed on the backside of the first epitaxial layer.

When the device is reversely biased, in the longitudinal direction from the drain region to the bottom surface of the channel region, the voltage of the drift region gradually decreases, a voltage difference between the source conductive material layer and the drift region gradually decreases, and depletion capability with respect to the drift region at a side close to the channel region is enhanced due to the feature that a spacing between the second field plate conductive material layer and the drift region is less than a spacing between the source conductive material layer and the drift region.

In a further improvement, the source region and the source conductive material layer are both connected to a source formed by a front side metal layer by means of a corresponding contact.

The gate conductive material layer is connected to a gate formed by the front side metal layer by means of the corresponding contact.

The second field plate conductive material layer is connected to the source by means of the corresponding contact.

In a further improvement, a first side surface of the first top sub-trench and a second side surface of the second top sub-trench are spaced apart, and a second side surface of the first top sub-trench and a side surface of the source conductive material layer are spaced apart or the second side surface of the first top sub-trench is located on the side surface of the source conductive material layer.

In a further improvement, the source region and the source conductive material layer are both connected to a source formed by a front side metal layer by means of a corresponding contact.

The gate conductive material layer is connected to a gate formed by the front side metal layer by means of the corresponding contact.

The second field plate conductive material layer is connected to the gate by means of the corresponding contact.

In a further improvement, a first side surface of the first top sub-trench and a second side surface of the second top sub-trench are spaced apart or the second side surface of the second top sub-trench is located on the first side surface of the first top sub-trench.

A second side surface of the first top sub-trench and a side surface of the source conductive material layer are spaced apart.

In a further improvement, the shielding dielectric layer is formed by stacking a first shielding dielectric layer and a second shielding dielectric layer, and an etching rate of the second shielding dielectric layer is greater than an etching rate of the first shielding dielectric layer; the first top sub-trench is formed in the second shielding dielectric layer, and the second top sub-trench is formed in the first shielding dielectric layer.

In a further improvement, the ratio of the etching rate of the second shielding dielectric layer to the etching rate of the first shielding dielectric layer comprises: 1.5:1, 2:1, and 3:1.

In a further improvement, the first shielding dielectric layer is a thermal oxide layer, and the second shielding dielectric layer is formed by means of CVD deposition.

In a further improvement, the material of the source conductive material layer comprises polysilicon, the material of the second field plate conductive material layer comprises polysilicon, and the material of the gate conductive material layer comprises polysilicon.

In order to solve the above technical problem, the method for manufacturing an SGT MOSFET device provided by the present application comprises the following steps:

step 1: forming a gate trench of a gate structure in a first epitaxial layer of a first conductivity type;

step 2: forming a shielding dielectric layer on an inner side surface of the gate trench, the shielding dielectric layer enclosing an intermediate trench in the gate trench;

step 3: filling the intermediate trench with a source conductive material layer;

step 4: forming a first top sub-trench and a second top sub-trench in the shielding dielectric layer at both sides of the source conductive material layer, wherein the depth of the first top sub-trench is greater than the depth of the second top sub-trench, and the first top sub-trench is located between the source conductive material layer and the second top sub-trench in the lateral direction; and a first side surface of the second top sub-trench is on a corresponding side surface of the gate trench;

step 5: forming a gate dielectric layer on the first side surface of the second top sub-trench;

step 6: forming a second field plate conductive material layer in the first top sub-trench and forming a gate conductive material layer in the second top sub-trench where the gate dielectric layer is formed;

step 7: forming a doped channel region of a second conductivity type in a surface region of the first epitaxial layer, wherein the junction depth of the channel region is less than or equal to the depth of the second top trench; and the first epitaxial layer at the bottom of the channel region forms a drift region;

step 8: forming a heavily doped source region of the first conductivity type on the surface of the channel region; and step 9: forming a heavily doped drain region of the first conductivity type on the backside of the first epitaxial layer.

When the device is reversely biased, in the longitudinal direction from the drain region to the bottom surface of the channel region, the voltage of the drift region gradually decreases, a voltage difference between the source conductive material layer and the drift region gradually decreases, and depletion capability with respect to the drift region at a side close to the channel region is enhanced due to the feature that a spacing between the second field plate conductive material layer and the drift region is less than a spacing between the source conductive material layer and the drift region.

In a further improvement, the method further comprises the following front side process steps after step 8 and before step 9:

forming an interlayer film, a contact, and a front side metal layer, and patterning the front side metal layer to form a source and a gate, wherein the source region and the source conductive material layer are both connected to the source by means of the corresponding contact.

The gate conductive material layer is connected to the gate by means of the corresponding contact.

The second field plate conductive material layer is connected to the source by means of the corresponding contact.

In a further improvement, a first side surface of the first top sub-trench and a second side surface of the second top sub-trench are spaced apart, and a second side surface of the first top sub-trench and a side surface of the source conductive material layer are spaced apart or the second side surface of the first top sub-trench is located on the side surface of the source conductive material layer.

In a further improvement, the method further comprises the following front side process steps after step 8 and before step 9:

forming an interlayer film, a contact, and a front side metal layer, and patterning the front side metal layer to form a source and a gate.

The source region and the source conductive material layer are both connected to the source formed by the front side metal layer by means of the corresponding contact;

The gate conductive material layer is connected to the gate formed by the front side metal layer by means of the corresponding contact.

The second field plate conductive material layer is connected to the gate by means of the corresponding contact.

In a further improvement, a first side surface of the first top sub-trench and a second side surface of the second top sub-trench are spaced apart or the second side surface of the second top sub-trench is located on the first side surface of the first top sub-trench.

A second side surface of the first top sub-trench and a side surface of the source conductive material layer are spaced apart.

In a further improvement, the shielding dielectric layer is formed by stacking a first shielding dielectric layer and a second shielding dielectric layer, and an etching rate of the second shielding dielectric layer is greater than an etching rate of the first shielding dielectric layer; the first top sub-trench is formed in the second shielding dielectric layer, and the second top sub-trench is formed in the first shielding dielectric layer.

In a further improvement, the ratio of the etching rate of the second shielding dielectric layer to the etching rate of the first shielding dielectric layer comprises: 1.5:1, 2:1, and 3:1.

In a further improvement, step 2 comprises the following sub-steps:

forming a thermal oxide layer on the inner side surface of the gate trench by means of a thermal oxidation process, the thermal oxide layer forming the first shielding dielectric layer; and forming the second shielding dielectric layer on the first shielding dielectric layer by performing a CVD deposition process.

In a further improvement, step 4 comprises the following sub-steps:

defining formation regions of the first top sub-trench and the second top sub-trench by means of a lithography process, wherein the formation region of the first top sub-trench is located in the second shielding dielectric layer, and the formation region of the second top sub-trench is located in the first shielding dielectric layer; and simultaneously forming the first top sub-trench and the second top sub-trench by performing etching, wherein the etching rate of the second shielding dielectric layer is greater than the etching rate of the first shielding dielectric layer such that the depth of the first top sub-trench is greater than the depth of the second top sub-trench.

In a further improvement, the material of the source conductive material layer comprises polysilicon, the material of the second field plate conductive material layer comprises polysilicon, and the material of the gate conductive material layer comprises polysilicon.

The gate structure of the SGT MOSFET device of the present application still adopts the left-right structure. On the basis of the second existing left-right structure, the present application adds, between the source polysilicon and the polysilicon gate, the second field plate conductive material layer filling the first top sub-trench. The depth of the second field plate conductive material layer is greater than the depth of the polysilicon gate, so that the second field plate conductive material layer can laterally deplete the drift region close to the channel region when the device is reversely biased. Moreover, the spacing between the second field plate conductive material layer and the drift region is less than the spacing between the source conductive material layer and the drift region; therefore, compared with the second existing left-right structure provided with no second field plate conductive material layer, the present application can enhance the depletion capability with respect to the drift region at the side close to the channel region. In this way, the distribution of the electric field intensity in the drift region can be more uniform, the withstand voltage of the device can be improved, and the specific on-resistance of the device can be reduced.

Furthermore, compared with the third existing left-right structure, the present application can enhance the depletion capability with respect to the drift region at the side close to the channel region just by adding the second field plate conductive material layer filling the first top sub-trench, without a shielding dielectric layer with a thickness gradually varying in the longitudinal direction. That is, the second field plate conductive material layer of the present application can be formed just by means of trench etching and filling processes. Compared with the third existing structure, the present application can reduce the process difficulty of the device.

Furthermore, the structure of the shielding dielectric layer of the present application can be formed by stacking the first shielding dielectric layer and the second shielding dielectric layer, wherein the etching rate of the second shielding dielectric layer is greater than that of the first shielding dielectric layer. For example, the first shielding dielectric layer is a thermal oxidation layer, and the second shielding dielectric layer is formed by means of CVD deposition; the first top sub-trench is formed in the second shielding dielectric layer, and the second top sub-trench corresponding to the gate conductive material layer is formed in the first shielding dielectric layer. Due to the feature that the etching rate of the second shielding dielectric layer is greater than the etching rate of the first shielding dielectric layer, the first top sub-trench and the second top sub-trench can be formed simultaneously, and the second field plate conductive material layer and the gate conductive material layer can also be formed simultaneously. Therefore, the introduction of the second field plate conductive material layer in the present application substantially does not increase process costs.

In addition, the second shielding dielectric layer of the present application is formed by mean of CVD deposition, and is, for example, an oxide layer or other insulating layer formed by the CVD deposition. The CVD deposition process may generate bubbles in the second shielding dielectric layer, thus not only increasing the etching rate of the second shielding dielectric layer, but also appropriately reducing the dielectric constant of the second shielding dielectric layer. When the dielectric constant of the second shielding dielectric layer becomes lower, according to the Gauss theorem, under the same breakdown voltage, the thickness of the second shielding dielectric layer can be reduced, thereby reducing the pitch of the device, reducing the specific on-resistance, and optimizing the performance.

BRIEF DESCRIPTION OF THE DRAWINGS

The present application is described below in detail with reference to the drawings and specific embodiments.

DETAILED DESCRIPTION OF THE DISCLOSURE

Figure 1:
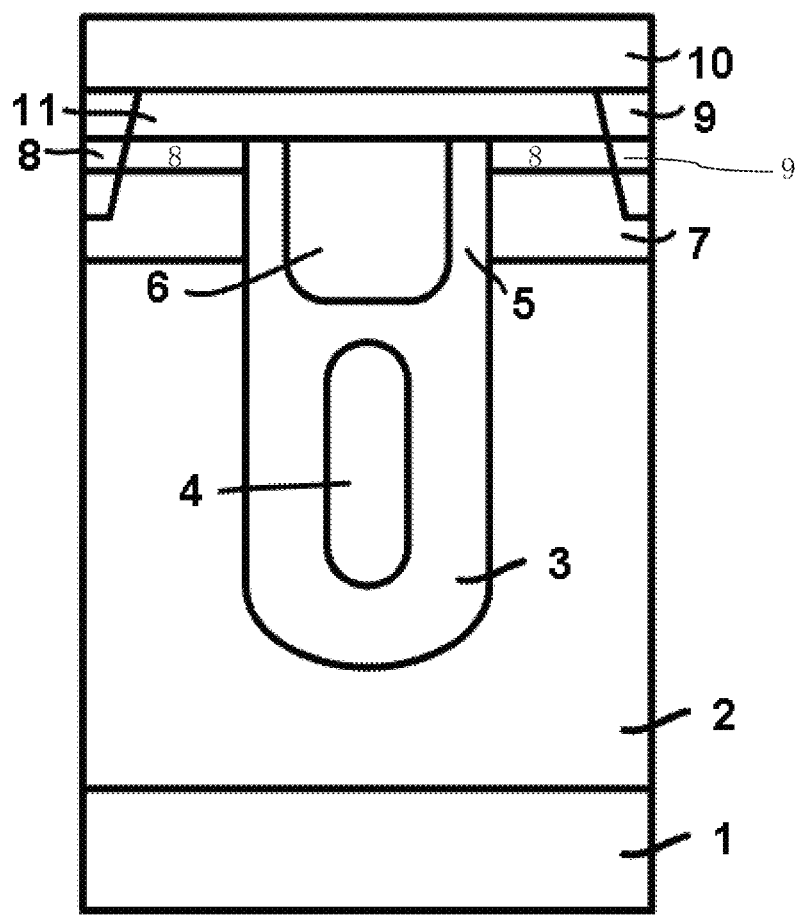
FIG. 1 is a schematic diagram of a structure of a first existing SGT MOSFET device.
Figure 2:
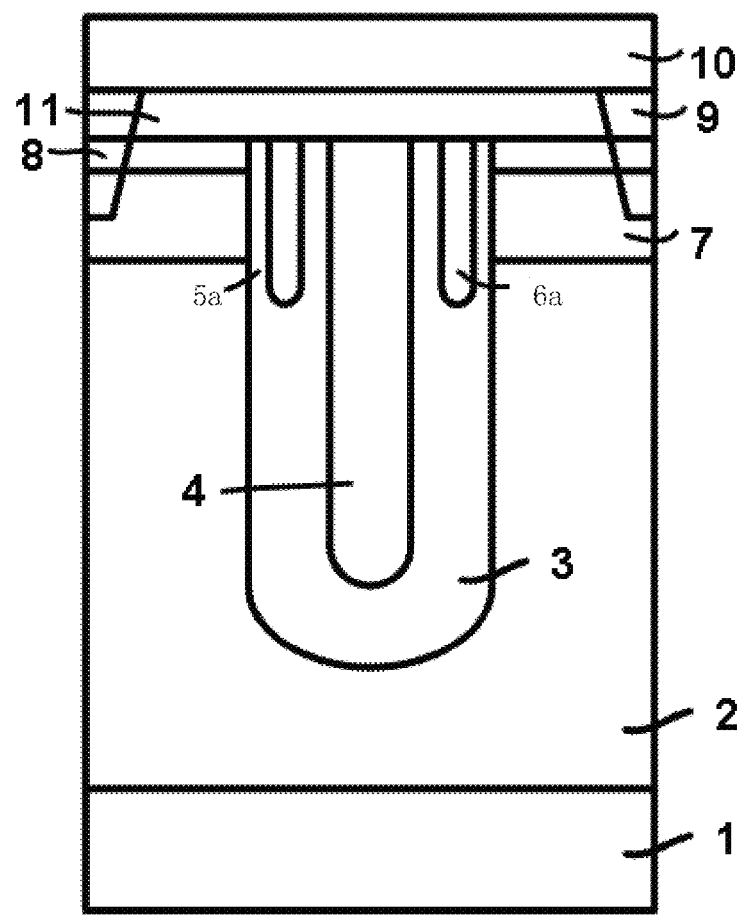
FIG. 2 is a schematic diagram of a structure of a second existing SGT MOSFET device.
Figure 3:
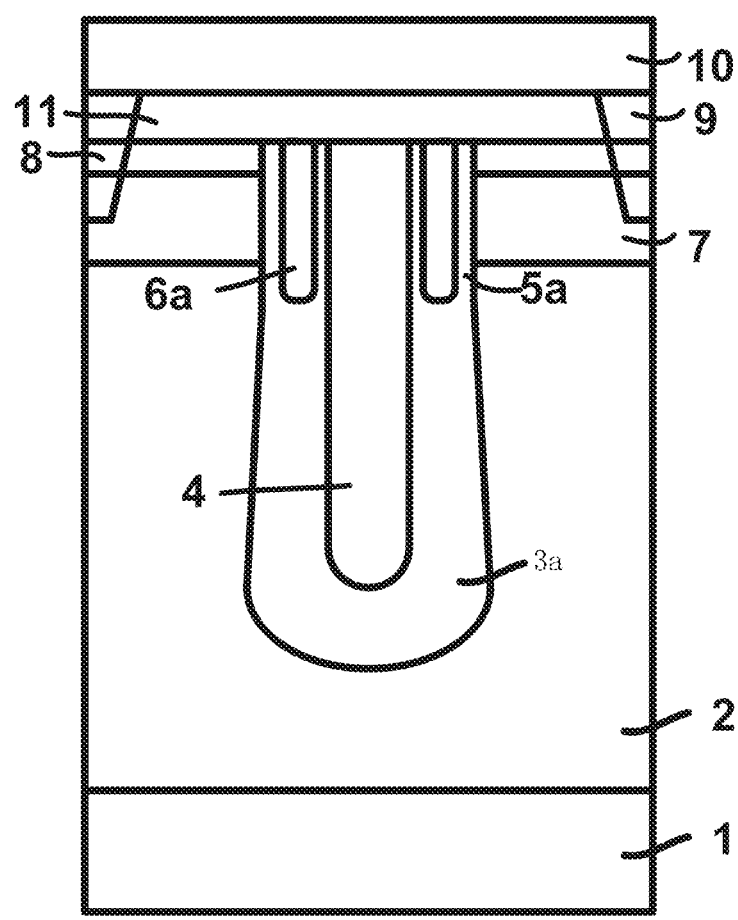
FIG. 3 is a schematic diagram of a design structure of a third existing SGT MOSFET device.
Figure 4:
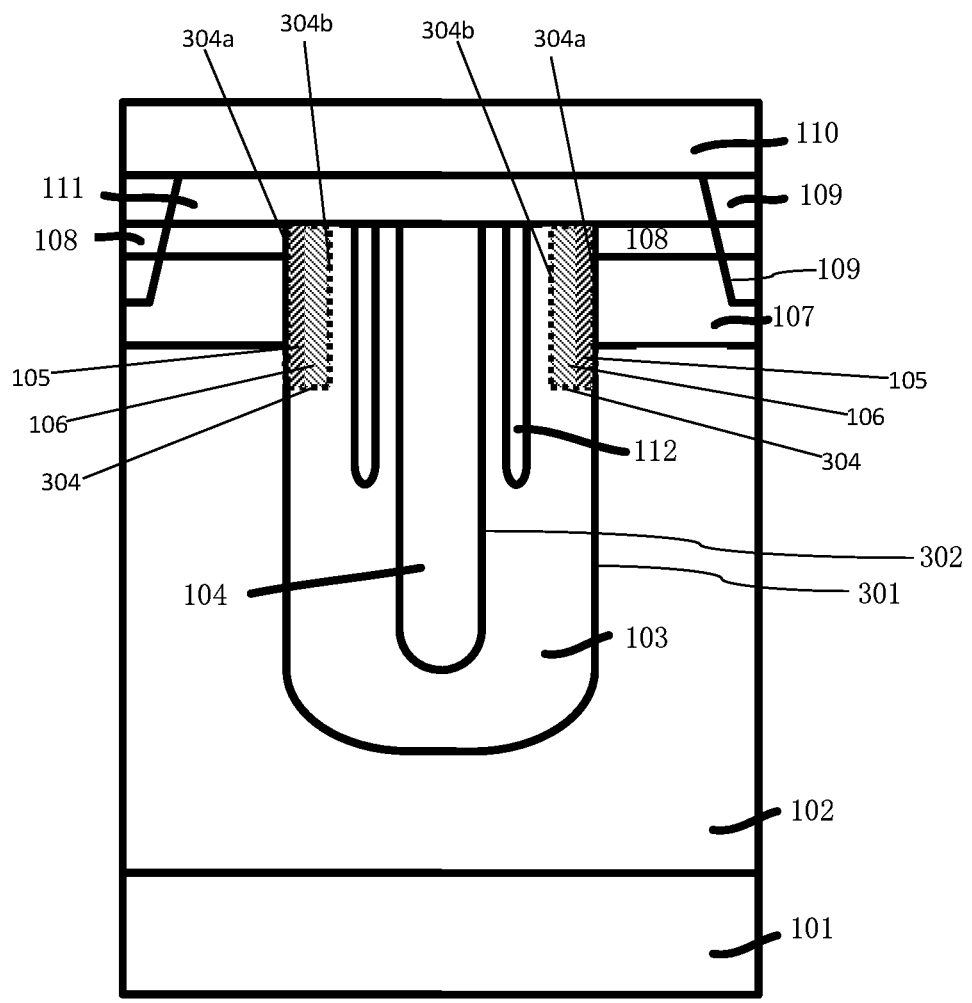
FIG. 4 is a schematic diagram of a structure of an SGT MOSFET device in a first embodiment of the present application.

An SGT MOSFET device in a first embodiment of the present application:

FIG. 4 is a schematic diagram of a structure of the SGT MOSFET device in the first embodiment of the present application. A gate structure of the SGT MOSFET device in the first embodiment of the present application includes: a gate trench 301, a shielding dielectric layer 103, a source conductive material layer 104, a second field plate conductive material layer 112, and a gate conductive material layer 106.

The shielding dielectric layer 103 is formed on an inner side surface of the gate trench 301, and the shielding dielectric layer 103 encloses an intermediate trench 302 in the gate trench 301. The source conductive material layer 104 fills the intermediate trench 302.

The second field plate conductive material layer 112 is formed in a first top sub-trench 303 at both sides of the source conductive material layer 104, and the gate conductive material layer 106 is formed in a second top sub-trench 304 at both sides of the source conductive material layer 104.

The first top sub-trench 303 and the second top sub-trench 304 are both formed in the shielding dielectric layer 103.

The depth of the first top sub-trench 303 is greater than the depth of the second top sub-trench 304, and the first top sub-trench 303 is located between the source conductive material layer 104 and the second top sub-trench 304 in the lateral direction.

A first side surface 304a of the second top sub-trench 304 is on a corresponding side surface of the gate trench 301, and the gate conductive material layer 106 and the first side surface 304a of the second top sub-trench 304 are spaced apart by a gate dielectric layer 105 provided therebetween. In the first embodiment of the present application, the gate dielectric layer 105 is a gate oxide layer.

The second field plate conductive material layer 112 fully fills the first top sub-trench 303.

The gate trench 301 is formed in a first epitaxial layer 102 of a first conductivity type.

The first epitaxial layer 102 is formed on a semiconductor substrate such as a silicon substrate 101, and the semiconductor substrate 101 is a heavily doped structure of the first conductivity type.

A doped channel region 107 of a second conductivity type is formed in a surface region of the first epitaxial layer 102, and the second top trench penetrates through the channel region 107.

The first epitaxial layer 102 at the bottom of the channel region 107 forms a drift region, and a heavily doped source region 108 of the first conductivity type is formed on the surface of the channel region 107. A heavily doped drain region of the first conductivity type is formed on the backside of the first epitaxial layer 102. In the first embodiment of the present application, the drain region is formed by the thinned semiconductor substrate 101 or formed by performing backside heavily doped ion implantation on the basis of the thinned semiconductor substrate 101.

When the device is reversely biased, in the longitudinal direction from the drain region to the bottom surface of the channel region 107, the voltage of the drift region gradually decreases, a voltage difference between the source conductive material layer 104 and the drift region gradually decreases, and depletion capability with respect to the drift region at a side close to the channel region 107 is enhanced due to the feature that a spacing between the second field plate conductive material layer 112 and the drift region is less than a spacing between the source conductive material layer 104 and the drift region.

The source region 108 and the source conductive material layer 104 are both connected to a source formed by a front side metal layer 110 by means of a corresponding contact 109.

The gate conductive material layer 106 is connected to a gate formed by the front side metal layer 110 by means of the corresponding contact 109.

The second field plate conductive material layer 112 is connected to the source by means of the corresponding contact 109.

In the first embodiment of the present application, a first side surface of the first top sub-trench 303 and a second side surface 304b of the second top sub-trench 304 are spaced apart, and a second side surface of the first top sub-trench 303 and a side surface of the source conductive material layer 104 are spaced apart. Alternatively, since the second field plate conductive material layer 112 is also connected to the source, the second side surface of the first top sub-trench 303 may be located on the side surface of the source conductive material layer 104, in which case the second field plate conductive material layer 112 can be in direct contact with the source conductive material layer 104.

In the first embodiment of the present application, the shielding dielectric layer 103 is formed by stacking a first shielding dielectric layer 103a and a second shielding dielectric layer 103b. Please refer to FIG. 5B for the first shielding dielectric layer 103a and the second shielding dielectric layer 103b. An etching rate of the second shielding dielectric layer 103b is greater than an etching rate of the first shielding dielectric layer 103a. In some examples, the ratio of the etching rate of the second shielding dielectric layer 103b to the etching rate of the first shielding dielectric layer 103a includes: 1.5:1, 2:1, and 3:1. The first top sub-trench 303 is formed in the second shielding dielectric layer 103b, and the second top sub-trench 304 is formed in the first shielding dielectric layer 103a.

In the first embodiment of the present application, the first shielding dielectric layer 103a is a thermal oxide layer, and the second shielding dielectric layer 103b is formed by means of CVD deposition. For example, the second shielding dielectric layer 103b is an oxide layer formed by the CVD deposition. The CVD deposition process may generate bubbles in the second shielding dielectric layer 103b, thus increasing the etching rate of the second shielding dielectric layer 103b and reducing the dielectric constant of the second shielding dielectric layer 103b, and thereby further improving the performance of the device.

In the first embodiment of the present application, the material of the source conductive material layer 104 is polysilicon, the material of the second field plate conductive material layer 112 is polysilicon, and the material of the gate conductive material layer 106 is polysilicon. In other embodiments, the source conductive material layer 104, the second field plate conductive material layer 112, and the gate conductive material layer 106 may also be made of other conductive materials.

The gate structure of the SGT MOSFET device in the first embodiment of the present application still adopts the left-right structure. On the basis of the second existing left-right structure, the first embodiment of the present application adds, between the source polysilicon and the polysilicon gate, the second field plate conductive material layer 112 filling the first top sub-trench 303. The depth of the second field plate conductive material layer 112 is greater than the depth of the polysilicon gate, so that the second field plate conductive material layer 112 can laterally deplete the drift region close to the channel region 107 when the device is reversely biased. Moreover, the spacing between the second field plate conductive material layer 112 and the drift region is less than the spacing between the source conductive material layer 104 and the drift region; therefore, compared with the second existing left-right structure provided with no second field plate conductive material layer 112, the first embodiment of the present application can enhance the depletion capability with respect to the drift region at the side close to the channel region 107. In this way, the distribution of the electric field intensity in the drift region can be more uniform, the withstand voltage of the device can be improved, and the specific on-resistance of the device can be reduced.

Furthermore, compared with the third existing left-right structure, the first embodiment of the present application can enhance the depletion capability with respect to the drift region at the side close to the channel region 107 just by adding the second field plate conductive material layer 112 filling the first top sub-trench 303, without a shielding dielectric layer 103 with a thickness gradually varying in the longitudinal direction. That is, the second field plate conductive material layer 112 in the first embodiment of the present application can be formed just by means of trench etching and filling processes. Compared with the third existing structure, the first embodiment of the present application can reduce the process difficulty of the device.

Furthermore, the structure of the shielding dielectric layer in the first embodiment of the present application can be formed by stacking the first shielding dielectric layer 103a and the second shielding dielectric layer 103b, wherein the etching rate of the second shielding dielectric layer 103b is greater than that of the first shielding dielectric layer 103a. For example, the first shielding dielectric layer 103a is a thermal oxidation layer, and the second shielding dielectric layer 103b is formed by means of CVD deposition; the first top sub-trench 303 is formed in the second shielding dielectric layer 103b, and the second top sub-trench 304 corresponding to the gate conductive material layer 106 is formed in the first shielding dielectric layer 103a. Due to the feature that the etching rate of the second shielding dielectric layer 103b is greater than the etching rate of the first shielding dielectric layer 103a, the first top sub-trench 303 and the second top sub-trench 304 can be formed simultaneously, and the second field plate conductive material layer 112 and the gate conductive material layer 106 can also be formed simultaneously. Therefore, the introduction of the second field plate conductive material layer 112 in the first embodiment of the present application substantially does not increase process costs.

In addition, the second shielding dielectric layer 103b in the first embodiment of the present application is formed by mean of CVD deposition, and is, for example, an oxide layer or other insulating layer formed by the CVD deposition. The CVD deposition process may generate bubbles in the second shielding dielectric layer 103b, thus not only increasing the etching rate of the second shielding dielectric layer 103b, but also appropriately reducing the dielectric constant of the second shielding dielectric layer 103b. When the dielectric constant of the second shielding dielectric layer 103b becomes lower, according to the Gauss theorem, under the same breakdown voltage, the thickness of the second shielding dielectric layer 103b can be reduced, thereby reducing the pitch of the device, reducing the specific on-resistance, and optimizing the performance.

An SGT MOSFET device in a second embodiment of the present application.

The difference between the SGT MOSFET device in the second embodiment of the present application and the SGT MOSFET in the first embodiment of the present application lies in that: the SGT MOSFET device in the first embodiment of the present application has the following feature:

The second field plate conductive material layer 112 is connected to the gate by means of the corresponding contact 109.

Compared with the structure in which the second field plate conductive material layer 112 is connected to the source in the first embodiment of the present application, the structure in which the second field plate conductive material layer 112 is connected to the gate in the second embodiment of the present application can achieve better effects. The explanation is as follows:

When the device is reversely biased, the voltage of the gate and the voltage of the source are substantially the same. In this case, the second field plate conductive material layer 112 in the second embodiment of the present application has a depletion effect on the drift region substantially same as that in the first embodiment of the present application.

Moreover, when the device is in a positive conducting state, the second field plate conductive material layer 112 in the second embodiment of the present application has a carrier accumulation effect on the drift region covering the side, thus reducing the on-resistance of the device.

However, the connection between the second field plate conductive material layer 112 and the gate in the second embodiment of the present application increases gate capacitance of the device and increases a loss in a switching process. Therefore, it is more suitable for occasions where the requirement on a switching speed is not high.

As a further improvement to the first and second embodiments of the present application, the second field plate conductive material layer 112 can be connected to other voltages different from the voltage of the source electrode and the voltage of the gate electrode as required.

In the second embodiment of the present application, since the second field plate conductive material layer 112 is connected to the gate, the second field plate conductive material layer 112 can be isolated from the gate conductive material layer 106. In this case, the structural diagram is the same as FIG. 4. and the first side surface of the first top sub-trench 303 and the second side surface 304b of the second top sub-trench 304 are spaced apart. Alternatively, the second field plate conductive material layer 112 can be in contact with the gate conductive material layer 106, in which case the second side surface 304b of the second top sub-trench 304 is located on the first side surface of the first top sub-trench 303.

The second side surface of the first top sub-trench 303 and the side surface of the source conductive material layer 104 are spaced apart.

Figure 5A:
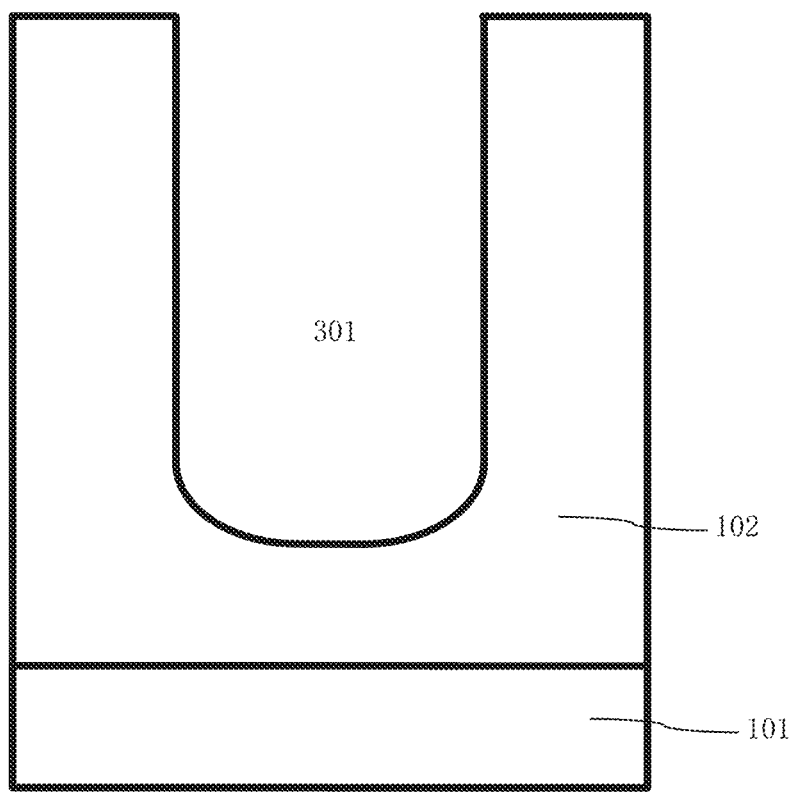
FIG. 5A-FIG. 5E are schematic diagrams of device structures in various steps of a method for manufacturing an SGT MOSFET device in the first embodiment of the present application.

A method for manufacturing an SGT MOSFET device in the first embodiment of the present application:

FIG. 5A-FIG. 5E are schematic diagrams of device structures in various steps of the method for manufacturing an SGT MOSFET device in the first embodiment of the present application. The method for manufacturing an SGT MOSFET device in the first embodiment of the present application includes the following steps:

Step 1. Referring to FIG. 5A, a gate trench 301 of a gate structure is formed in a first epitaxial layer 102 of a first conductivity type.

In the first embodiment of the present application, the first epitaxial layer 102 is formed on a semiconductor substrate such as a silicon substrate 101, and the semiconductor substrate 101 is a heavily doped structure of the first conductivity type.

Figure 5B:
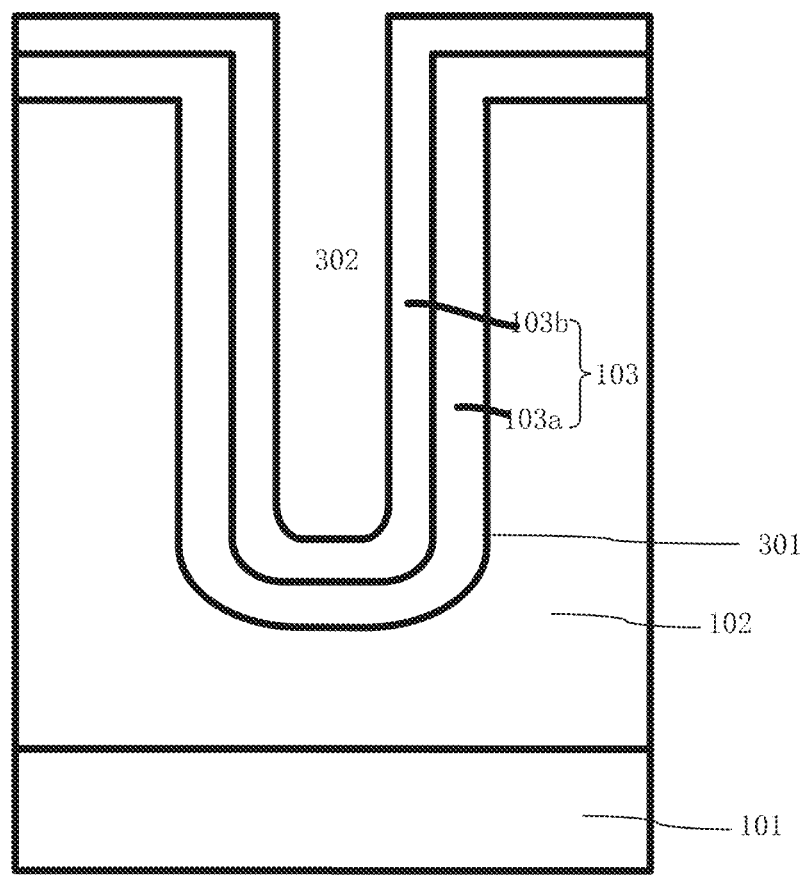

Step 2. Referring to FIG. 5B, a shielding dielectric layer 103 is formed on an inner side surface of the gate trench 301, the shielding dielectric layer 103 enclosing an intermediate trench 302 in the gate trench 301.

In the first embodiment of the present application, the shielding dielectric layer 103 is formed by stacking a first shielding dielectric layer 103a and a second shielding dielectric layer 103b. An etching rate of the second shielding dielectric layer 103b is greater than an etching rate of the first shielding dielectric layer 103a. For example, the ratio of the etching rate of the second shielding dielectric layer 103b to the etching rate of the first shielding dielectric layer 103a includes: 1.5:1, 2:1, and 3:1. Subsequently, the first top sub-trench 303 is formed in the second shielding dielectric layer 103b, and the second top sub-trench 304 is formed in the first shielding dielectric layer 103a.

In some examples, step 2 includes the following sub-steps:

A thermal oxide layer is formed on the inner side surface of the gate trench 301 by means of a thermal oxidation process, and the thermal oxide layer forms the first shielding dielectric layer 103a.

The second shielding dielectric layer 103a is formed on the first shielding dielectric layer 103a by performing a CVD deposition process. The material of the second shielding dielectric layer 103b includes an oxide layer, and bubbles can be introduced into the second shielding dielectric layer 103b to adjust the etching rate and the dielectric constant of the second shielding dielectric layer 103b.

Referring to FIG. 5B, the first shielding dielectric layer 103a and the second shielding dielectric layer 103b extend to the surface of the first epitaxial layer 102 outside the gate trench 301.

Figure 5C:
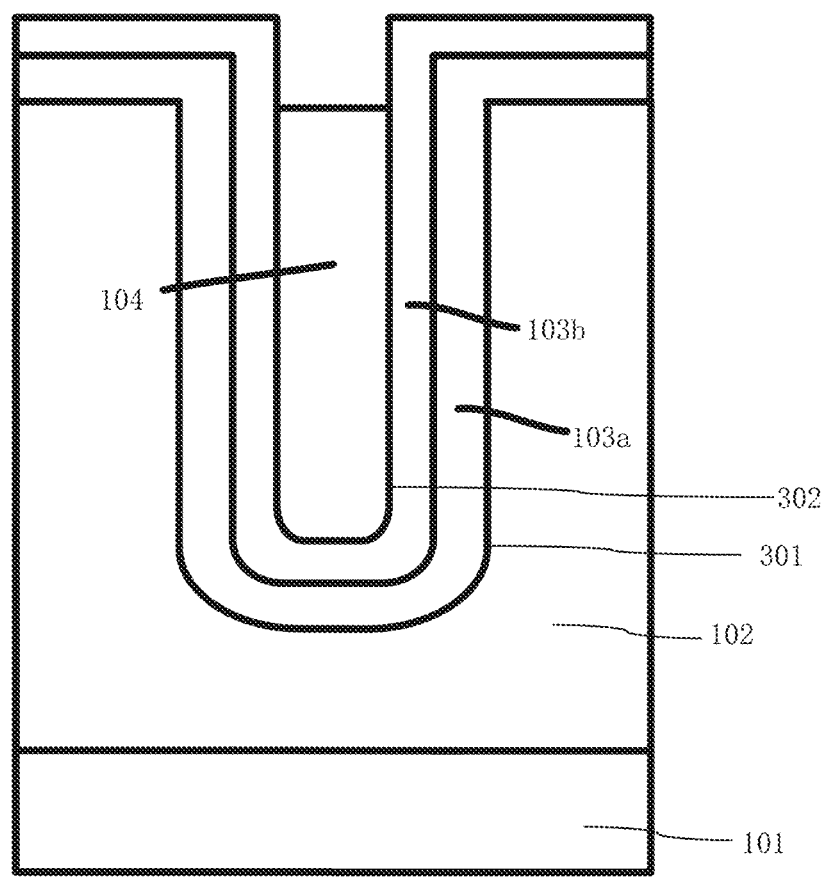

Step 3. Referring to FIG. 5C, the intermediate trench 302 is filled with a source conductive material layer 104.

In the first embodiment of the present application, the source conductive material layer 104 is made of polysilicon and is formed by means of polysilicon deposition and etching-back.

Figure 5D:
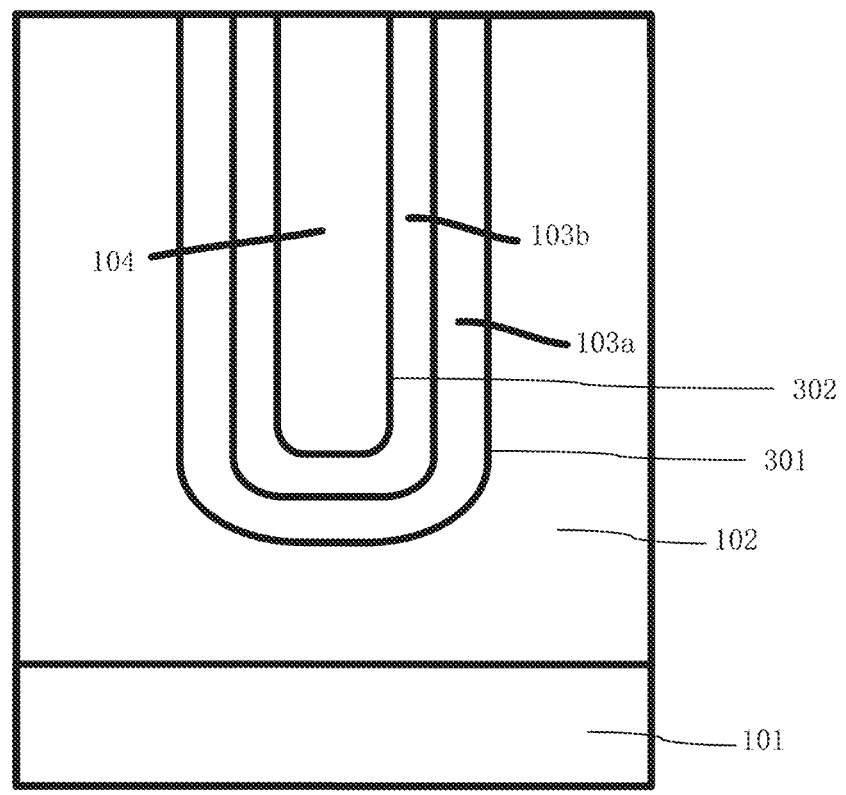

Then, referring to FIG. 5D, an etching-back or chemical mechanical polishing (CMP) process is performed to remove the first shielding dielectric layer 103a and the second shielding dielectric layer 103b outside the gate trench 301.

Step 4. A first top sub-trench 303 and a second top sub-trench 304 are formed in the shielding dielectric layer 103 at both sides of the source conductive material layer 104.

The depth of the first top sub-trench 303 is greater than the depth of the second top sub-trench 304, and the first top sub-trench 303 is located between the source conductive material layer 104 and the second top sub-trench 304 in the lateral direction.

A first side surface 304a of the second top sub-trench 304 is on a corresponding side surface of the gate trench 301.

Figure 5E:
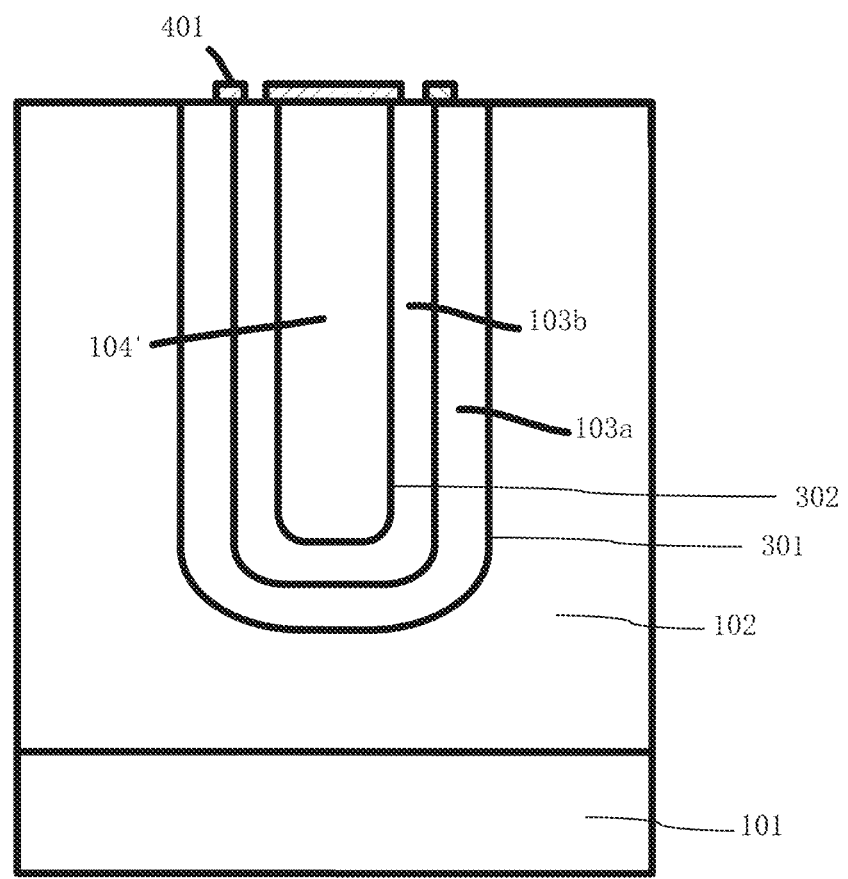

Referring to FIG. 5E, a photoresist pattern 401 is formed by means of a lithography process, so as to define formation regions of the first top sub-trench 303 and the second top sub-trench 304, wherein the formation region of the first top sub-trench 303 is located in the second shielding dielectric layer 103b, the formation region of the second top sub-trench 304 is located in the first shielding dielectric layer 103a.

Referring to FIG. 4, the first top sub-trench 303 and the second top sub-trench 304 are simultaneously formed by performing etching, wherein the etching rate of the second shielding dielectric layer 103b is greater than the etching rate of the first shielding dielectric layer 103a such that the depth of the first top sub-trench 303 is greater than the depth of the second top sub-trench 304.

Please refer to FIG. 4 for subsequent steps.

Step 5. A gate dielectric layer 105 is formed on the first side surface 304a of the second top sub-trench 304.

Step 6. A second field plate conductive material layer 112 is formed in the first top sub-trench 303 and a gate conductive material layer 106 is formed in the second top sub-trench 304 where the gate dielectric layer 105 is formed.

In the method in the first embodiment of the present application, the material of the second field plate conductive material layer 112 is polysilicon, and the material of the gate conductive material layer 106 is polysilicon. In step 6, the second field plate conductive material layer 112 and the gate conductive material layer 106 are simultaneously formed by means of polysilicon filling and etching-back processes.

Step 7. A doped channel region 107 of a second conductivity type is formed in a surface region of the first epitaxial layer 102, wherein the junction depth of the channel region 107 is less than or equal to the depth of the second top trench.

The first epitaxial layer 102 at the bottom of the channel region 107 forms a drift region.

Step 8. A heavily doped source region 108 of the first conductivity type is formed on the surface of the channel region 107.

An interlayer film 111, a contact 109, and a front side metal layer 110 are formed, and the front side metal layer 110 is patterned to form a source and a gate, wherein the source region 108 and the source conductive material layer 104 are both connected to the source by means of the corresponding contact 109.

The gate conductive material layer 106 is connected to the gate by means of the corresponding contact 109.

The second field plate conductive material layer 112 is connected to the source by means of the corresponding contact 109, in which case the above-mentioned SGT MOSFET device in the first embodiment of the present application is formed. Alternatively, the second field plate conductive material layer 112 is connected to the gate by means of the corresponding contact 109, in which case the above-mentioned SGT MOSFET device in the second embodiment of the present application is formed. Devices in other embodiments can be obtained when the second field plate conductive material layer 112 is connected to other potentials by means of the corresponding contact 109.

In the device structure formed by the method in the first embodiment of the present application, a first side surface of the first top sub-trench 303 and a second side surface 304b of the second top sub-trench 304 are spaced apart, and a second side surface of the first top sub-trench 303 and a side surface of the source conductive material layer 104 are spaced apart. In a method in another embodiment, the following structure can be formed: the second side surface of the first top sub-trench 303 is located on the side surface of the source conductive material layer 104, in which case only the SGT MOSFET device structure in the first embodiment of the present application can be formed, that is, the second field plate conductive material layer 112 is connected to the source.

Step 9. A heavily doped drain region of the first conductivity type is formed on the backside of the first epitaxial layer 102. The drain region is directly formed by the thinned semiconductor substrate 101 or formed by performing backside heavily doped ion implantation on the basis of the thinned semiconductor substrate 101.

Then, a drain formed by a backside metal layer is formed on the backside of the drain region.

When the device is reversely biased, in the longitudinal direction from the drain region to the bottom surface of the channel region 107, the voltage of the drift region gradually decreases, a voltage difference between the source conductive material layer 104 and the drift region gradually decreases, and depletion capability with respect to the drift region at a side close to the channel region 107 is enhanced due to the feature that a spacing between the second field plate conductive material layer 112 and the drift region is less than a spacing between the source conductive material layer 104 and the drift region.

A method for manufacturing an SGT MOSFET device in the second embodiment of the present application:

Steps 1 to step 3 of the method in the second embodiment of the present application are the same as those of the method in the first embodiment of the present application. For drawings corresponding to step 1 to step 3 of the method in the second embodiment of the present application, please refer to FIG. 5A-FIG. 5D.

Figure 6A:
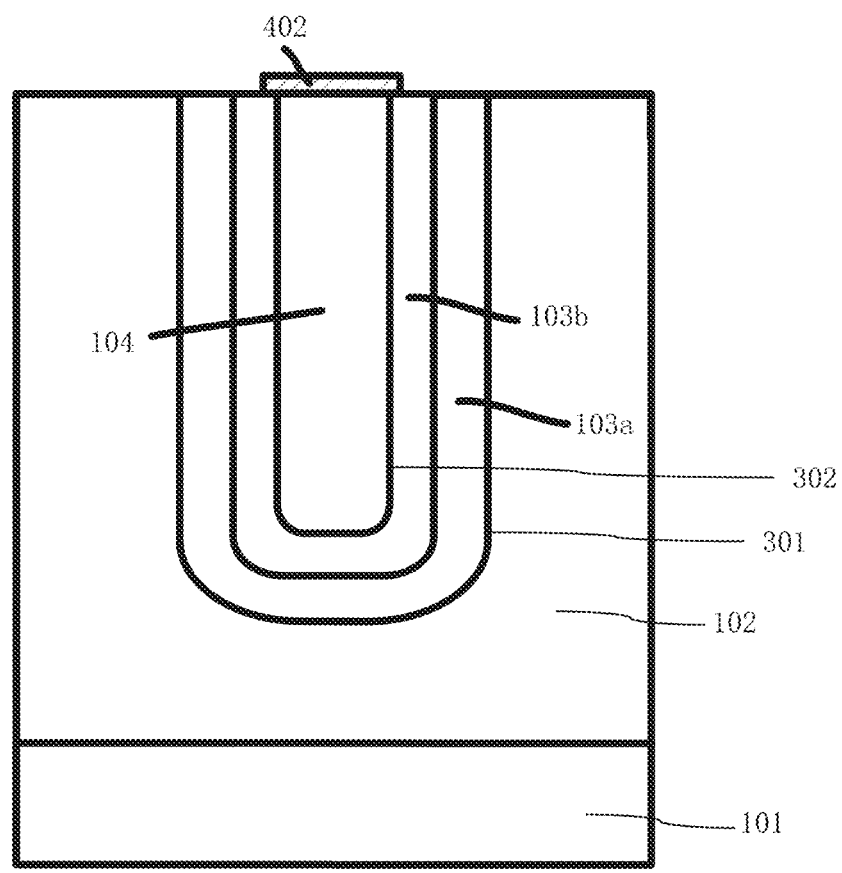
FIG. 6A-FIG. 6B are schematic diagrams of device structures in step 4 of a method for manufacturing an SGT MOSFET device in a second embodiment of the present application.
Figure 6B:
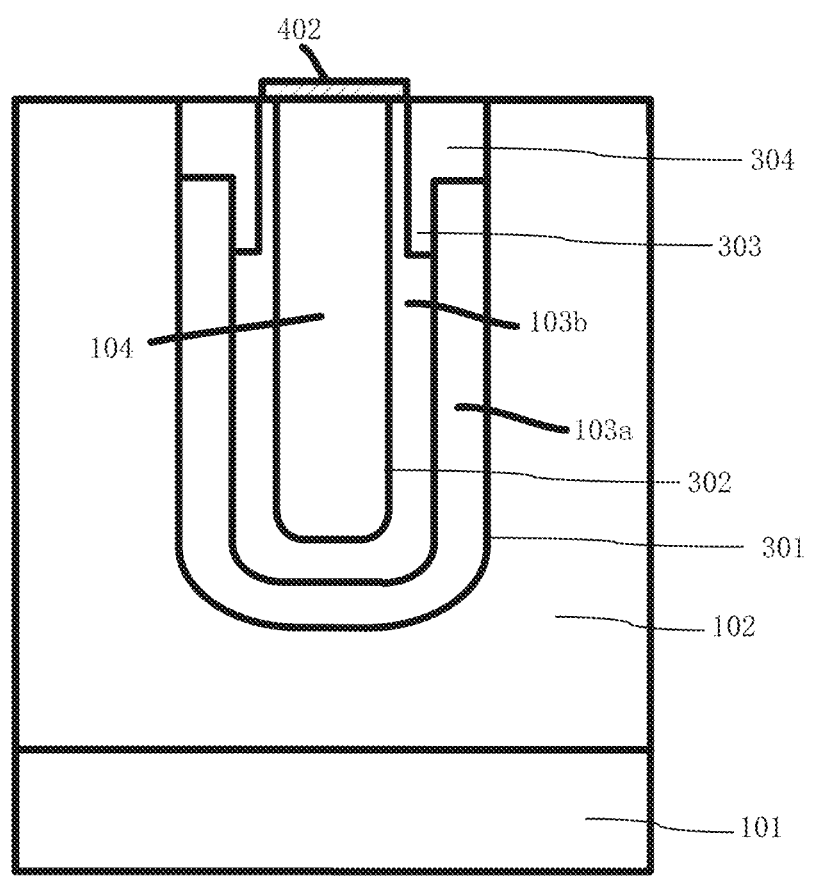

The difference between the method for manufacturing an SGT MOSFET device in the second embodiment of the present application and the method for manufacturing an SGT MOSFET device in the first embodiment of the present application lies only in step 4. FIG. 6A-FIG. 6B are schematic diagrams of device structures in step 4 of the method for manufacturing an SGT MOSFET device in the second embodiment of the present application. Step 4 of the method for manufacturing an SGT MOSFET device in the first embodiment of the present application has the following feature:

Step 4. Referring to FIG. 6A, a photoresist pattern 402 is formed by means of a lithography process, so as to define formation regions of the first top sub-trench 303 and the second top sub-trench 304, wherein the formation region of the first top sub-trench 303 is located in the second shielding dielectric layer 103*b*, the formation region of the second top sub-trench 304 is located in the first shielding dielectric layer 103*a*. In FIG. 6A, the formation regions of the first top sub-trench 303 and the second top sub-trench 304 are connected together.

Referring to FIG. 6B, the first top sub-trench 303 and the second top sub-trench 304 are simultaneously formed by performing etching, wherein the etching rate of the second shielding dielectric layer 103*b* is greater than the etching rate of the first shielding dielectric layer 103*a* such that the depth of the first top sub-trench 303 is greater than the depth of the second top sub-trench 304.

Referring to FIG. 6B, the second side surface of the second top sub-trench 304 is located on the first side surface of the first top sub-trench 303, that is, the second top sub-trench 304 and the first top sub-trench 303 are connected together.

After the second field plate conductive material layer 112 and the gate conductive material layer 106 are formed in the subsequent step 6, the second field plate conductive material layer 112 is in direct contact with the side surface of the gate conductive material layer 106. Therefore, the manufacturing method in the second embodiment of the present application can only form the above-mentioned device in the second embodiment of the present application, i.e., the structure in which the second field plate conductive material layer 112 is connected to the gate.

Compared with the method in the first embodiment of the present application, an opening of the photoresist pattern 402 of the first top sub-trench 303 and the second top sub-trench 304 of the method in the second embodiment of the present application is larger, so the lithography process is simpler and the etching process after the lithography is also simpler.

An improvement to the method in the second embodiment of the present application includes: omitting the lithography process corresponding to the photoresist pattern 402, and directly performing etching under a condition where the source conductive material layer 104 and the first epitaxial layer 102 are self-aligned, so as to form the first top sub-trench 303 and the second top sub-trench 304. In this way, one mask can be saved, thus saving the costs. However, the disadvantage of such the method lies in that: the spacing between the second field plate conductive material layer 112 and the source conductive material layer 104 is reduced, eventually increasing the gate capacitance.

Another improvement to the method in the second embodiment of the present application includes: omitting the step of performing an etching-back or chemical mechanical polishing (CMP) process to remove the first shielding dielectric layer 103*a* and the second shielding dielectric layer 103*b* outside the gate trench 301 corresponding to FIG. 5D, and directly performing step 4 on the basis of FIG. 5C, so as to save one process step, thus saving the costs.

The present application is described above in detail via specific embodiments, but these embodiments do not intended to limit the present application. Without departing from the principle of the present application, those skilled in the art can make many modifications and improvements, which shall also be regarded as the protection scope of the present application.

What is claimed is:

1. A shield gate trench (SGT) MOSFET device, wherein a gate structure thereof comprises:
    a gate trench, a shielding dielectric layer, a source conductive material layer, a second field plate conductive material layer, and a gate conductive material layer;
    the shielding dielectric layer is formed on an inner side surface of the gate trench, and the shielding dielectric layer encloses an intermediate trench in the gate trench;
    the source conductive material layer fills the intermediate trench;
    the second field plate conductive material layer is formed in a first top sub-trench at both sides of the source conductive material layer, and the gate conductive material layer is formed in a second top sub-trench at both sides of the source conductive material layer;
    the first top sub-trench and the second top sub-trench are both formed in the shielding dielectric layer;
    a depth of the first top sub-trench is greater than a depth of the second top sub-trench, and the first top sub-trench is located between the source conductive material layer and the second top sub-trench in a lateral direction;
    a first side surface of the second top sub-trench is on a corresponding side surface of the gate trench, and the gate conductive material layer and the first side surface of the second top sub- trench are spaced apart by a gate dielectric layer provided therebetween;
    the second field plate conductive material layer fully fills the first top sub-trench;
    the gate trench is formed in a first epitaxial layer of a first conductivity type, a doped channel region of a second conductivity type is formed in a surface region of the first epitaxial layer, and the second top sub-trench penetrates through the channel region;
    the first epitaxial layer at the bottom of the channel region forms a drift region, and a heavily doped source region of the first conductivity type is formed on the surface of the channel region;
    a heavily doped drain region of the first conductivity type is formed on the backside surface of the first epitaxial layer; and
    when the device is reversely biased, in a longitudinal direction from the drain region to the bottom surface of the channel region, a voltage of the drift region gradually decreases, a voltage difference between the source conductive material layer and the drift region gradually decreases, and depletion capability with respect to the drift region at a side close to the channel region is enhanced due to the feature that a spacing between the second field plate conductive material layer and the drift region is less than a spacing between the source conductive material layer and the drift region.

2. The SGT MOSFET device according to claim 1, wherein the source region and the source conductive material layer are both connected to a source formed by a front side metal layer by means of a corresponding contact;
    the gate conductive material layer is connected to a gate formed by the front side metal layer by means of the corresponding contact; and the second field plate conductive material layer is connected to the source by means of the corresponding contact.

3. The SGT MOSFET device according to claim 2, wherein a first side surface of the first top sub-trench and a second side surface of the second top sub-trench are spaced apart, and a second side surface of the first top sub-trench and a side surface of the source conductive material layer are spaced apart or the second side surface of the first top sub-trench is located on the side surface of the source conductive material layer.

4. The SGT MOSFET device according to claim 1, wherein the source region and the source conductive material layer are both connected to a source formed by a front side metal layer by means of a corresponding contact;
the gate conductive material layer is connected to a gate formed by the front side metal layer by means of the corresponding contact; and
the second field plate conductive material layer is connected to the gate by means of the corresponding contact.

5. The SGT MOSFET device according to claim 4, wherein a first side surface of the first top sub-trench and a second side surface of the second top sub-trench are spaced apart or the second side surface of the second top sub-trench is located on the first side surface of the first top sub-trench; and a second side surface of the first top sub-trench and a side surface of the source conductive material layer are spaced apart.

6. The SGT MOSFET device according to claim 1, wherein the shielding dielectric layer is formed by stacking a first shielding dielectric layer and a second shielding dielectric layer, and an etching rate of the second shielding dielectric layer is greater than an etching rate of the first shielding dielectric layer, and wherein the first top sub-trench is formed in the second shielding dielectric layer, and the second top sub-trench is formed in the first shielding dielectric layer.

7. The SGT MOSFET device according to claim 6, wherein a ratio of the etching rate of the second shielding dielectric layer to the etching rate of the first shielding dielectric layer comprises: 1.5:1, 2:1, and 3:1.

8. The SGT MOSFET device according to claim 6, wherein the first shielding dielectric layer is a thermal oxide layer, and the second shielding dielectric layer is formed by means of CVD deposition.

9. The SGT MOSFET device according to claim 1, wherein a material of the source conductive material layer comprises polysilicon, a material of the second field plate conductive material layer comprises polysilicon, and a material of the gate conductive material layer comprises polysilicon.

* * * * *